United States Patent [19]

Chance et al.

[11] Patent Number: 5,146,308
[45] Date of Patent: Sep. 8, 1992

[54] SEMICONDUCTOR PACKAGE UTILIZING EDGE CONNECTED SEMICONDUCTOR DICE

[75] Inventors: Randal W. Chance; Eugene H. Cloud, both of Boise, Id.

[73] Assignee: Micron Technology, Inc., Boise, Id.

[21] Appl. No.: 593,177

[22] Filed: Oct. 5, 1990

[51] Int. Cl.$^5$ ............................................. H01L 23/02
[52] U.S. Cl. ...................................... 357/55; 357/68; 357/65
[58] Field of Search .................... 357/55, 75, 80, 68, 357/65

[56] References Cited

U.S. PATENT DOCUMENTS

| 3,492,536 | 1/1970 | Girolamo et al. | 357/68 |
| 4,697,204 | 9/1987 | Mita et al. | 357/80 |
| 4,922,378 | 5/1990 | Malhi et al. | 357/75 |

FOREIGN PATENT DOCUMENTS

| 52-58468 | 5/1977 | Japan . | |
| 56-71926 | 6/1981 | Japan . | |
| 61-88547 | 5/1986 | Japan | 357/80 |
| 62-78859 | 4/1987 | Japan . | |
| 63-143 | 1/1988 | Japan . | |
| 63-208252 | 8/1988 | Japan . | |

OTHER PUBLICATIONS

"High Density Chip Carrier with Protected Leads", IBM TDB, vol. 31, No. 2, Jul. 1988, pp. 238-239.

*Primary Examiner*—Jerome Jackson, Jr.
*Assistant Examiner*—Viet Q. Nguyen
*Attorney, Agent, or Firm*—Stanley N. Protigal

[57] ABSTRACT

Die bond locations on a semiconductor die are formed as vertical inserts along the edge of the die. The vertical inserts are isolated from substrate and are exposed by a wafer saw process, in which dice are singulated from a wafer. The configuration offers the advantages of a more efficient layout, allowing the entire top surface of the die to be passivated, a better contact configuration, and more convenient assembly for packaging.

15 Claims, 7 Drawing Sheets

SEMICONDUCTOR PACKAGE UTILIZING EDGE CONNECTED SEMICONDUCTOR DICE

BACKGROUND OF THE INVENTION

1. Field of the Invention:

This invention generally relates to layout of integrated circuits (ICs), and more particularly to a configuration of bondpads used to connect an integrated circuit die to a first level package.

2. Description of the Related Art:

An electronic circuit is chemically and physically integrated into a substrate such as a silicon wafer by patterning regions in the substrate, and by patterning layers on the substrate. These regions and layers can be conductive, for conductor and resistor fabrication. They can also be of differing conductivity types, which is essential for transistor and diode fabrication. Degrees of resistance, capacitance, or conductivity are controllable, as are the physical dimensions and locations of the patterned regions and layers, making circuit integration possible.

In this disclosure, "n" denotes silicon that has been doped with atoms having more than four valence electrons (group V or higher), such as arsenic, which introduce negatively charged majority carriers into the silicon, and "p" denotes silicon doped with atoms having less than four valence electrons (group III or lower), such as boron or phosphorus, which introduce positively charged majority carriers. The majority charge carrier type is also referred to as conductivity type. A plus or minus superscript on an n or p indicates heavy or light doping, respectively. "Poly" denotes polycrystalline silicon, which is often used for resistor fabrication. Geometries and doping directly affect poly resistivity.

Integrated semiconductor devices are typically constructed en masse on a wafer of silicon or gallium arsenide. Each device generally takes the form of an integrated circuit (IC) die, which is attached to a leadframe with gold wires. The die and leadframe are then encapsulated in a plastic or ceramic package, which is then recognizable as an IC (integrated circuit). ICs come in a variety of forms such as dynamic random access memories (DRAMs), static random access memories (SRAMs), read only memories (ROMs), gate arrays, and so forth. The ICs are interconnected in myriad combinations on printed circuit boards by a number of techniques, such as socketing and soldering.

This invention relates to connection circuitry for connecting the circuits which are on the IC die to external circuits, as through a leadframe.

The attachment of the die to the leadframe with the gold wires is referred to as wirebonding. Wirebonding consists of using heat and pressure, along with ultrasonic energy to fuse the gold wire to an attachment point on the die, known as a die pad. In a typical process, the leadframe with a die mounted to it is heated to 230°, and ultrasonic energy in the range of 40-74 mW @ 60 KHz is applied. The ultrasonic energy is sufficient to break through an oxide coating on aluminum diepads on the wafer in order that the gold wires may bond to the diepads. The result is a fusion bond.

Semiconductor packaging has been referred to in terms of "levels" of packaging. The chip capsule generally constitutes a first level of packaging. A second level would then be a "card" or a printed circuit board. A fourth level may follow the third level.

Such semiconductor devices typically take the form of a semiconductor die. The die is generally electrically attached to a leadframe within a package. The leadframe physically supports the die and provides electrical connections between the die and the outside world.

As illustrated in FIG. 1, a typical IC input includes a wirebond pad or die pad. The pad rests on a layer of silicon dioxide ("oxide") or polysilicon ("poly") which prevents short circuiting to substrate if the pad is punctured during wafer sort or assembly. The die is generally electrically attached (wirebonded) to the leadframe by means of fine gold wires which are wirebonded to the pads. These fine gold wires function to connect the die pads to the leadframe, so that the gold wires are electrically in series with the leadframe leads. The leadframe and die is then encapsulated, in the form of the familiar integrated circuit. The packaged chip is then able to be installed on a circuit board by any number of techniques, such as socketing and soldering.

TAB bonding uses similar pads, although material may be added to the pads to enhance bonding integrity. The pads on TAB circuits are referred to as "bumps" because of the additional material. This TAB technology is known to those skilled in the art of semiconductor assembly. Other technologies exist, in which pads or bumps are used to attach a semiconductor die to a first level package. In any case, the die attach or wirebonding process is complicated, in that each external connection lead must be attached to the die, usually either by pressure, pressure bonding or thermal bonding techniques.

The above technologies utilize connection points (such as the bondpads) which are on the horizontal surface of the semiconductor. The connection point occupies substantial "real estate" (surface area) on the chip which could otherwise be used for circuitry. The use edge surfaces of the die are not used for such connections.

The space between adjacent dice on a semiconductor wafer is variously called the street, saw alley, scribe lane, separation area and space between the dice. The street is provided as space for a die saw to cut the wafer into individual (singulated) dice. Generally, circuitry on the die must terminate before the street in order that the circuitry not short or leak current to substrate after the die is cut.

The tendency for circuitry which extends into the location of the die saw cut to leak current has meant that circuitry had to terminate before the street. It would be desireable to be able to extend some circuitry into the street area. Of particular interest is the die bond locations (die pads), which have areas which are large enough to be seen by the naked eye.

If the edge of the die can be used for external connections, then the required real estate for the die bond locations could be reduced.

It is possible to vertically mount multiple dice onto a single horizontal supporting substrate, otherwise called a chipmount or motherdie. In that arrangement, the multiple dice could be connected to the supporting substrate or as daughter dice, much as daughter boards on an electronic device may be connected to a motherboard.

By placing the die bond locations at the edge of the die or near the edge of the edge of the die, the die can be attached by direct contact with the edge of the die. If a daughter die is vertically mounted to a mother die or mounting substrate, then the die bond locations can coincide with the mounting location of the daughter die to the mother die or mounting substrate.

SUMMARY OF THE INVENTION

According to the invention, a semiconductor integrated circuit is formed with die bond locations along the edge of the die. This allows the die bond locations to consume less space on the die and allows the die bond points to be on the edge of the die.

In one configuration of the invention, the die bond points are formed as conductors which extend into the street areas of the wafer. The die bond points may extend between adjacent dice on the wafer, so that a cut with a die saw will expose edges of the conductors.

The die bond conductors are formed by forming recesses in the wafer, followed by depositing metal or other conductive material in the recesses. In order to prevent leakage, the recesses are treated prior to deposition of the conductor. Treatment to prevent leakage may include doping and forming a dielectric or insulator layer between the wafer and the conductor.

The die bond locations are exposed on the edges of the die during a wafer saw step, in which the dice are singulated with a wafer saw or other method for separating dice from a wafer.

In order that the die bond point is assured of being exposed by the die saw, the recess, where a die sawn cross section is suitable for a die bond location, must extend into the scribe line to an extent greater than permissible misalignment of the die saw. The die bond must also be located so as to avoid the action of the die saw from severing the connection of the die bond location to wafer circuitry. Furthermore, for purposes of probe, the die bond locations may include material which is either not passivated by dielectric (usually BPSG glazing material) or from which the passivation dielectric is removed.

The die bond locations may extend to adjacent dice, but if this is the case, the ability to probe dice should be provided.

DETAILED DESCRIPTION OF THE PREFERRED EMBODIMENT

Figure 1:
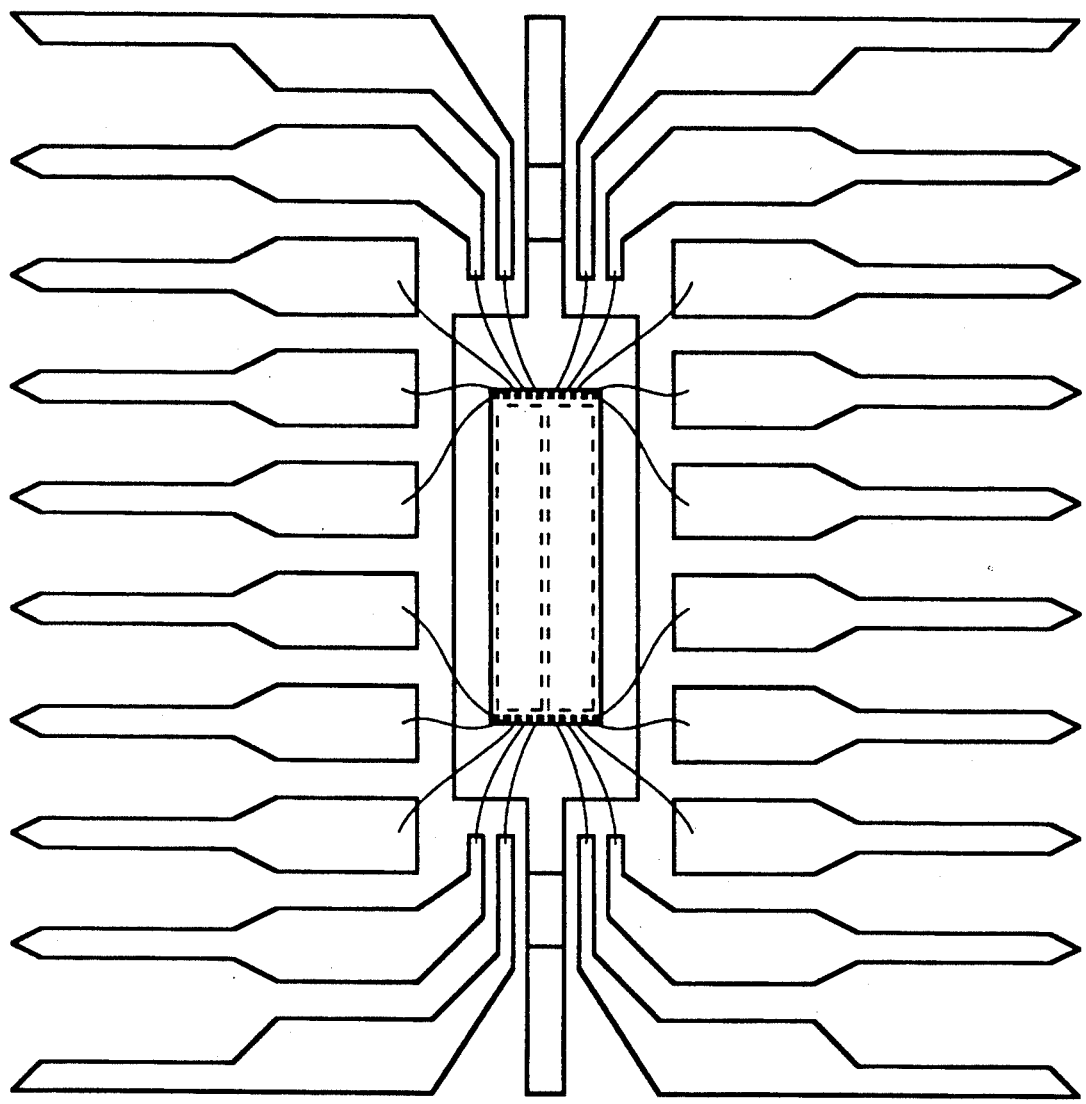
FIG. 1 is a schematic of typical IC input circuitry, showing prior art wirebond attachment.
Figure 2:
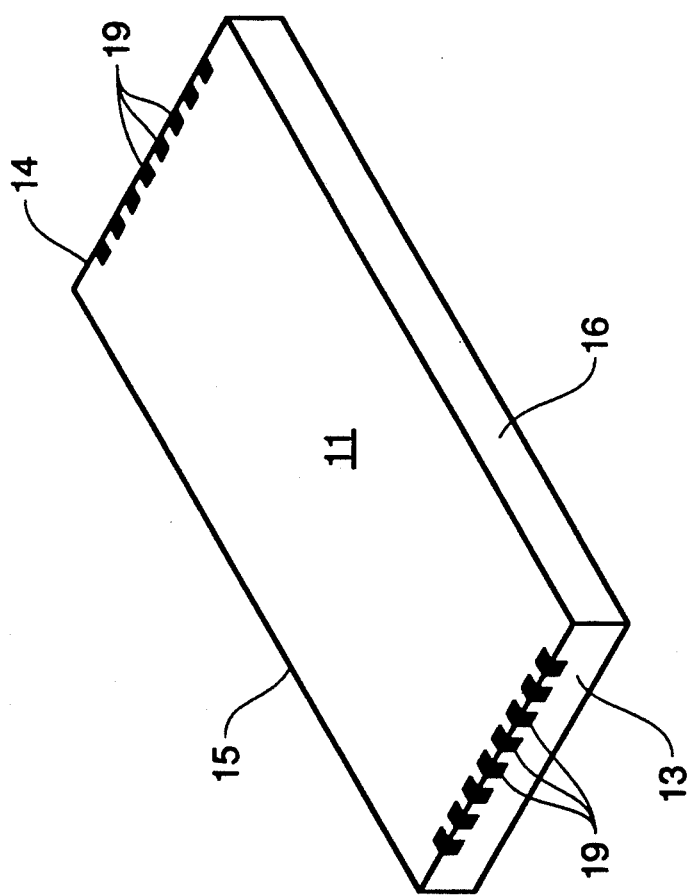
FIG. 2 shows a configuration of a semiconductor die in which edge die bond locations are used.

Referring to FIG. 2, a semiconductor die 11 which includes circuitry, such as logic circuitry, which is manufactured by a series of fabrication steps. The die 11 has a plurality of outer edges, including edges 13-16, and one or more of the edges 13, 14 is provided with die bond locations 19 extending along the edge 13, 14 of the die 11. As shown in FIG. 2, the die bond locations 19 extend partially down along the edges 13, 14 in order that die may be attached to external circuitry at the edges 13, 14.

Figure 3:
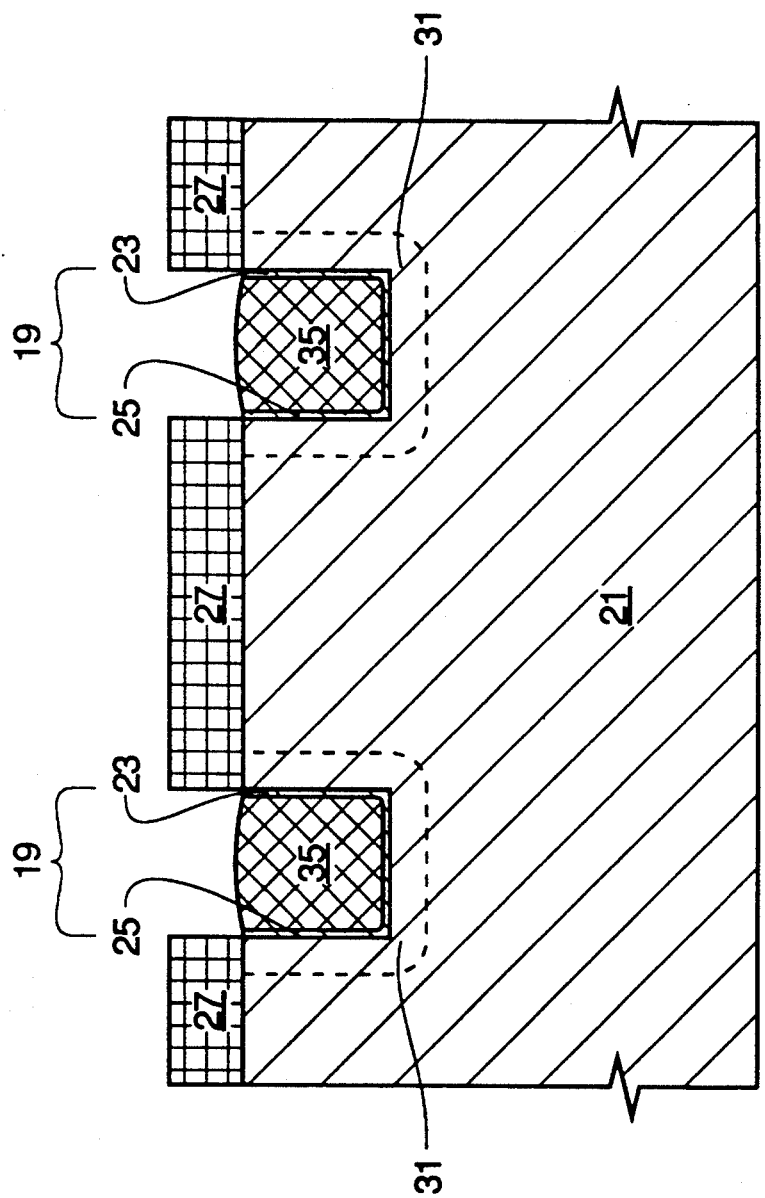
FIG. 3 shows a cross section of a wafer in which conductive material is deposited to form the die bond locations.

FIG. 3 shows the structure of a semiconductor wafer 21 at the die bond locations 19. In order to form the die bond locations 19, a recesses, such as recess 25 is formed in the wafer 21. The recess 25 is formed at the edge of die, such as an edge 13 or 14 of FIG. 2.

The recess 25 may be cut to a considerable depth, such as 12 microns out of a 500 micron thick wafer. By using plasma etch techniques, the etch process would take 300 minutes. Since the recesses 25 are separate from most of the wafer circuitry, the recesses 25 may be formed prior to the final fabrication steps. The recess would preferably extend into the wafer more than 1/500 the thickness of the wafer, but less than ½ the thickness of the wafer, and more preferably would extend into the wafer more than 1/100 the thickness of the wafer but less than 1/5 the thickness of the wafer.

The recesses 25 are preferably formed by masking the wafer 21 except at the intended locations of the recesses 25. A plasma or wet etch is used in order to form the recess 25 at locations in which a photomask 27 does not cover the wafer 21.

With the photomask 27 remaining on the etched wafer 21, the wafer 21 is doped with impurity which is of an opposite valence type as the wafer 21, to form wells 31 around the recesses 25. Sequential recesses 25 may share a single well 31, or separate wells may be provided for each recess 25. Therefore, if the wafer 21 consists of p type material, the impurity would be n type material. Likewise, if the wafer were n type, the recess would be doped with p type material. This creates a leakage barrier in order that a potential level at the die bond location to be applied within the recess will not cause current to leak to the wafer substrate 21

An oxide layer 23 is then formed on the surface of the recess 25. This provides positive insulation between the substrate 21 and material which will be used to fill the recess 25. The oxide layer 23 may be formed simultaneously with the formation of oxide during circuit fabrication (of logic circuitry on the wafer).

Conductive material 35 is then used to fill the recess 25. The conductive material 35 will form the die bond location when the die is cut from the wafer along an edge, such as edge 15 or 17. This cut edge will form a cross section similar to the cross section shown in FIG. 3.

The conductive material 35 may be applied by a variety of techniques, including chemical vapor deposition, plasma enhanced chemical vapor deposition (PECVD), sputtering, or photoplating. Electroplating techniques may be used to form the conductive material 35, in which a thin film of conductive material is deposited on the wafer to form an electroplating anode, followed by electroplating until the recesses 25 are filled.

Figure 4:
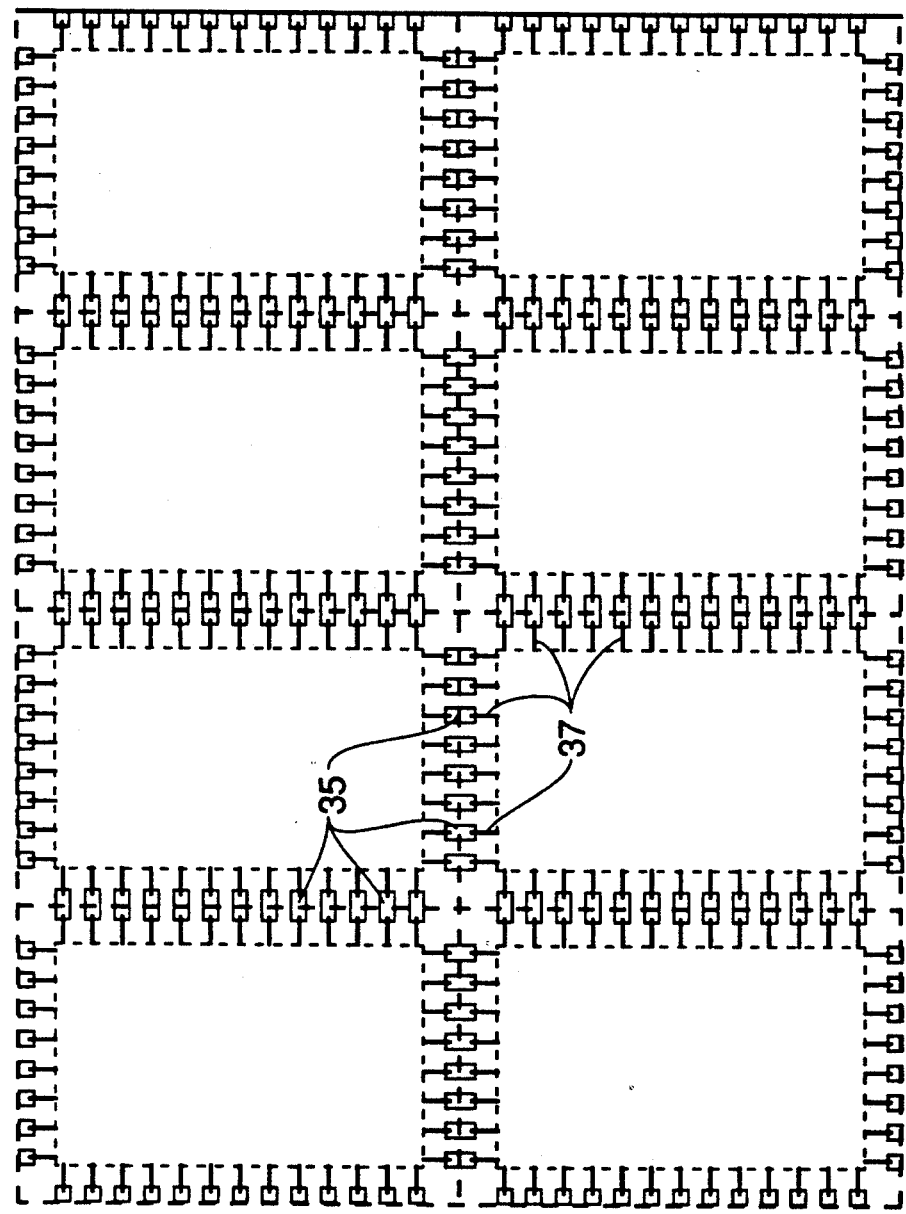
FIG. 4 shows a portion of a wafer in which conductive material is deposited across the street areas in order to fabricate the edge die bond locations of FIG. 2.

In order to establish electrical connections between circuitry on the wafer 21 and conductive material 35, conductive interconnect lines 37 are established between circuitry on the die and the conductive material 35, as shown in FIG. 4. The interconnect lines 37 may be formed as a part of a metal mask step in which a metallization layer is deposited on the semiconductor wafer. The metal mask step is followed by passivation, in which BPSG or other dielectric material is deposited on the wafer.

Figure 5:
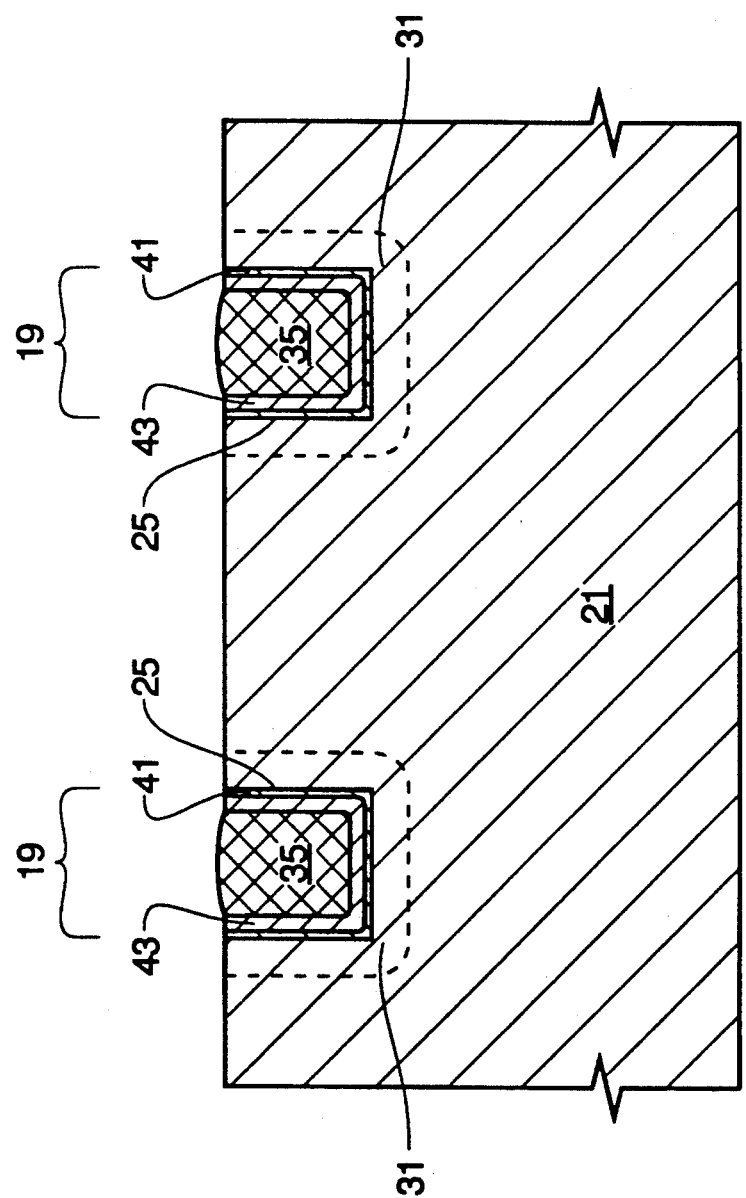
FIG. 5 shows a cross section of a wafer in which polysilicon is deposited over oxide in order to isolate the die bond locations from the wafer substrate.

FIG. 5 shows a configuration in which a thin layer of oxide 41 is deposited within the recesses 25. This is followed by a layer of polysilicon 43, which is subsequently filled with the conductive material 35. This configuration permits forming a resistance under the conductive material 35 so that a breech in the integrity of the oxide layer does not result in a substantial leak at the bond pad. The configuration of FIG. 5 may also be more suitable for integration into the process flow of the fabrication steps used in the manufacture of the circuitry on the die 11. As an example, the oxide layer 41 may be formed during the formation of a fabrication step in which oxide is grown on the wafer 11, and the polysilicon 43 can be a layer of polysilicon used to fabricate circuit elements such as transistors, capacitors and resistors.

Since the die bond locations occur along the edges of the dice, such as 13, 14, as a result of the dice being singulated, there is no need to provide a separate process step to expose the die bond locations 19 after passivation dielectric is applied to the wafer 21.

The die bond locations may be used for any type of die bond technique, including tab attach bonding (TAB), wirebond, bump bonding and any other conductive attachment of the die to external circuitry. The process also allows edge mounting multiple die within a single package.

Figure 6:
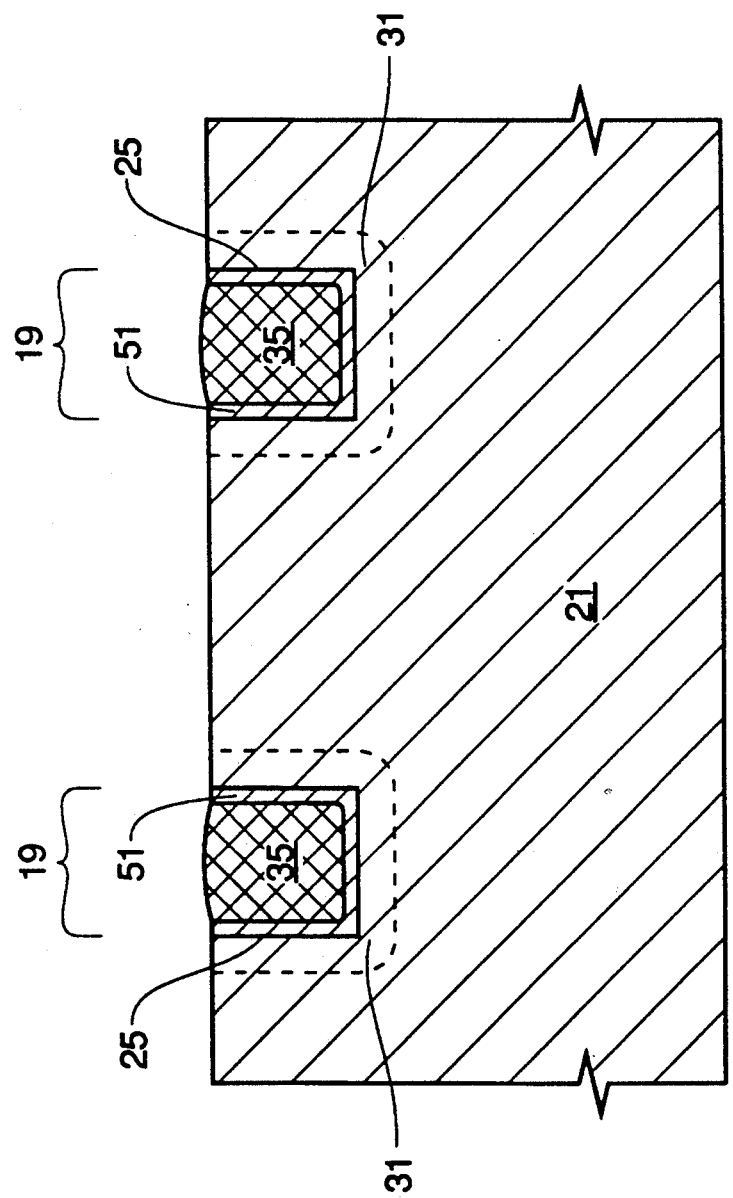
FIG. 6 shows a cross section of a wafer in which polysilicon is deposited to isolate the die bond locations from the wafer substrate.

A number of alternate embodiments are possible. For example, the specific configuration of a dielectric layer 23 and the formation of opposite valence wells may be considered to be redundant. It is possible to use polysilicon 51 of a predetermined valence type in lieu of either the dielectric or in lieu of the wells 31, in which case the structure would appear as shown in FIG. 6. It is also possible to use different materials than silicon, as would be the case if the circuit is a gallium arsenide type.

Figure 7:
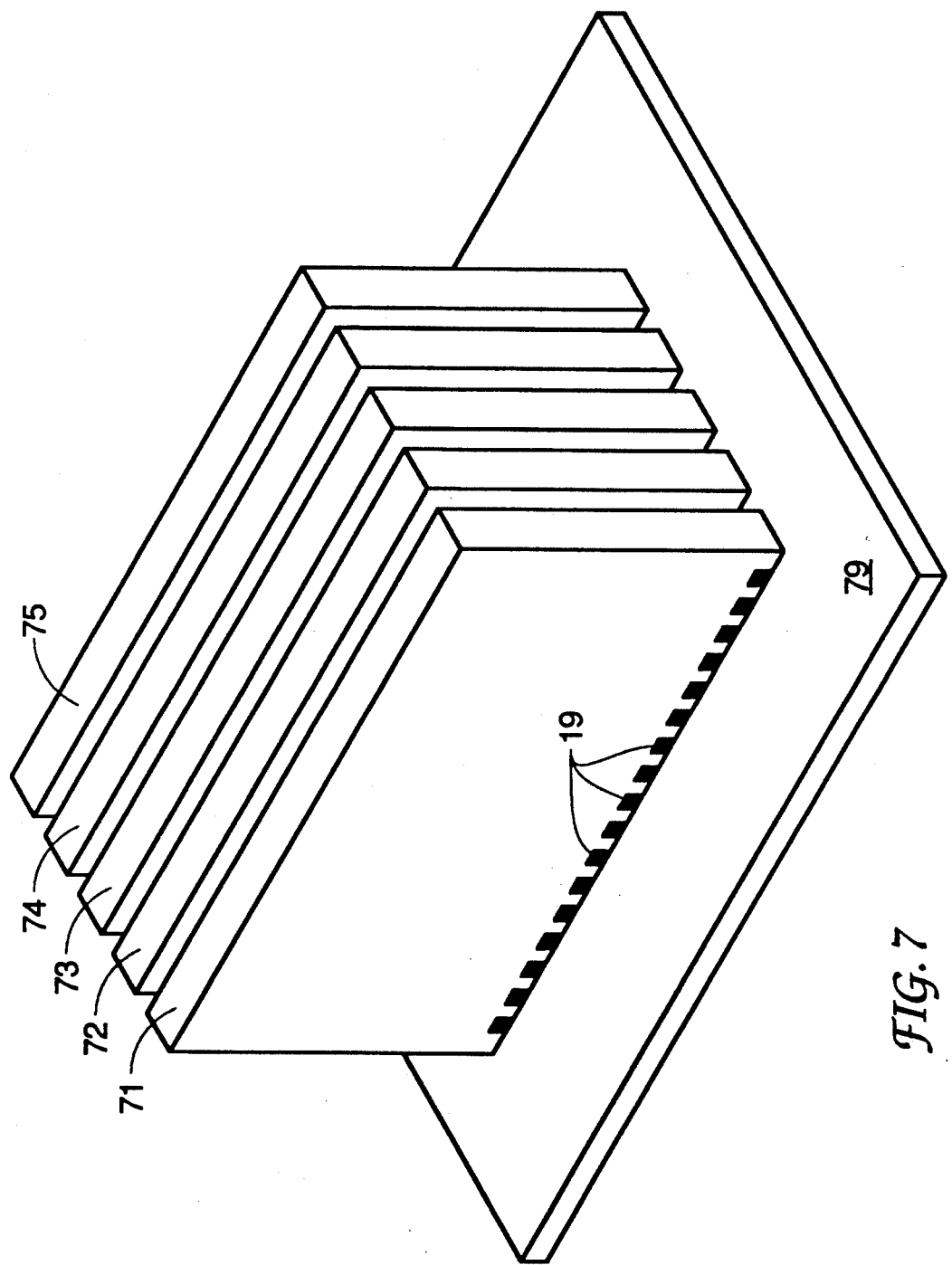
FIG. 7 shows a plurality of semiconductor dice in which edge die bond locations are used in the mounting of the dice to a supporting substrate in a high density package.

A plurality of semiconductor dice 71-75, in which edge die bond locations are used may be mounted to a supporting substrate 79, as shown in FIG. 7. The dice 71-75 which are so mounted may then be packaged as a high density integrated circuit. Since the edge connections are at the substrate, the attachment of the dice 71-75 permits direct electrical connection to the substrate 79 at the interface of the dice 71-75 to the substrate.

It is anticipated that variations in the specific structure of the die and of packaged integrated circuit chips may vary. Accordingly, the invention should be read as limited only by the appended claims.

We claim:

1. Semiconductor integrated circuit apparatus comprising:
   a) a supporting substrate having a top surface;
   b) a plurality of semiconductor dies mounted to said supporting substrate, each of the plurality of semiconductor dies having at least one exposed edge, the plurality of semiconductor dies being mounted to said supporting substrate such that said exposed edge on each die abuts the top surface of the supporting substrate;
   c) the semiconductor dies each having a semiconductor substrate and circuitry within the die;
   d) a plurality of depressions in said semiconductor dies, the depressions extending to the exposed edge;
   e) the semiconductor substrate being a first conductivity type;
   f) one or more wells in said substrate of a second conductivity type, said depressions being within said wells;
   g) bond pads disposed within said depressions, the bond pads being connected to said circuitry within the die to form bond pad locations for external electrical connection to the semiconductor dies;
   h) a first group of contacts on said supporting substrate, contacting said bond pads, and thereby establishing connections to said circuitry within the die; and
   i) the supporting substrate establishing electrical contact with the bond locations formed along said exposed edge.

2. Semiconductor integrated circuit apparatus of claim 1, further comprising:
   said depressions being formed to extend into the semiconductor dies more than 1/500 the thickness of the substrate, but less than ½ the thickness of the substrate.

3. Semiconductor integrated circuit apparatus of claim 1, further comprising:
   said depressions being formed to extend into the semiconductor dies more than 1/100 the thickness of the substrate, but less than about 1/5 the thickness of the substrate.

4. The semiconductor integrated circuit apparatus of claim 1, wherein said first conductivity type is p and said second conductivity type is n.

5. Semiconductor integrated circuit apparatus of claim 1, further comprising:
   a) a resistor, the resistor including substrate material within one of said wells; and
   b) said depressions being within said wells.

6. Semiconductor integrated circuit apparatus of claim 5, wherein:
   a) said material within one of said wells being a second conductivity type; and
   b) said first conductivity type is p and said second conductivity type is n.

7. Semiconductor integrated circuit apparatus of claim 1, further comprising:
   a) a layer of polysilicon in at least one of said depressions between the substrate and the bond pad located within said depression and above said layer of polysilicon; and
   b) said polysilicon being doped to a predetermined level.

8. Semiconductor integrated circuit apparatus of claim 1, further comprising:
   a layer of dielectric in at least one of said depressions between the substrate and the bond pad located within said recess.

9. Semiconductor integrated circuit apparatus comprising:
   a) a supporting substrate having a top surface;
   b) a plurality of semiconductor dies mounted to said supporting substrate, each of the plurality of semiconductor dies having at least one exposed edge, the plurality of semiconductor dies being mounted to said supporting substrate such that said exposed edge on each die abuts the top surface of the supporting substrate;
   c) the semiconductor dies each having a semiconductor substrate and circuitry within the die;

d) a plurality of depressions in said semiconductor dies, the depressions extending to the exposed edge;
e) bond pads disposed within said depressions, the bond pads being connected to said circuitry within the die to form bond pad locations for external electrical connection to the semiconductor dies;
f) a first group of contacts on said supporting substrate, contacting said bond pads, and thereby establishing connections to said circuitry within the die;
g) the supporting substrate establishing electrical contact with the bond locations formed along said exposed edge;
h) a layer of polysilicon in at least one of said depressions between the substrate and the bond pad located within said depression and above said layer of polysilicon; and
i) said polysilicon being doped to a predetermined level.

10. Semiconductor integrated circuit apparatus of claim 9, further comprising:
said depressions being formed to extend into the semiconductor dies more than 1/500 the thickness of the substrate, but less than ½ the thickness of the substrate.

11. Semiconductor integrated circuit apparatus of claim 9, further comprising:
said depressions being formed to extend into the semiconductor dies more than 1/100 the thickness of the substrate, but less than 1/5 the thickness of the substrate.

12. Semiconductor integrated circuit apparatus of claim 9, further comprising:
a layer of dielectric in at least one of said depressions between the substrate and the bond pad located within said recess.

13. Semiconductor integrated circuit apparatus comprising:
a) a supporting substrate having a top surface;
b) a plurality of semiconductor dies mounted to said supporting substrate, each of the plurality of semiconductor dies having at least one exposed edge, the plurality of semiconductor dies being mounted to said supporting substrate such that said exposed edge on each die abuts the top surface of the supporting substrate;
c) the semiconductor dies each having a semiconductor substrate and circuitry within the die;
d) a plurality of depressions in said semiconductor dies, the depressions extending to the exposed edge;
e) bond pads disposed within said depressions, the bond pads being connected to said circuitry within the die to form bond pad locations for external electrical connection to the semiconductor dies;
f) a layer of dielectric in at least one of said depressions between the substrate and the bond pad located within said recess;
g) a first group of contacts on said supporting substrate, contacting said bond pads, and thereby establishing connections to said circuitry within the die; and
h) the supporting substrate establishing electrical contact with the bond locations formed along said exposed edge.

14. Semiconductor integrated circuit apparatus of claim 13, further comprising:
said depressions being formed to extend into the semiconductor dies more than 1/500 the thickness of the substrate, but less than ½ the thickness of the substrate.

15. Semiconductor integrated circuit apparatus of claim 13, further comprising:
said depressions being formed to extend into the semiconductor dies more than 1/100 the thickness of the substrate, but less than 1/5 the thickness of the substrate.

* * * * *